United States Patent
Hoshi et al.

(10) Patent No.: US 9,425,345 B2
(45) Date of Patent: Aug. 23, 2016

(54) EPITAXIAL WAFER AND MANUFACTURING METHOD THEREOF

(71) Applicant: SHIN-ETSU HANDOTAI CO., LTD., Tokyo (JP)

(72) Inventors: Ryoji Hoshi, Nishigo-mura (JP); Masahiro Sakurada, Annaka (JP); Izumi Fusegawa, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 200 days.

(21) Appl. No.: 14/349,011

(22) PCT Filed: Oct. 2, 2012

(86) PCT No.: PCT/JP2012/006298
§ 371 (c)(1),
(2) Date: Apr. 1, 2014

(87) PCT Pub. No.: WO2013/057887
PCT Pub. Date: Apr. 25, 2013

(65) Prior Publication Data
US 2014/0374861 A1    Dec. 25, 2014

(30) Foreign Application Priority Data
Oct. 20, 2011    (JP) ................. 2011-230781

(51) Int. Cl.
*H01L 21/322* (2006.01)
*H01L 31/18* (2006.01)
(Continued)

(52) U.S. Cl.
CPC ............ *H01L 31/1804* (2013.01); *C30B 15/00* (2013.01); *C30B 15/20* (2013.01);
(Continued)

(58) Field of Classification Search
USPC .......................................... 438/476; 117/13
See application file for complete search history.

(56) References Cited

U.S. PATENT DOCUMENTS

| 5,405,803 A | 4/1995 | Kusaka |
| 5,923,071 A * | 7/1999 | Saito ................. H01L 21/76251 257/347 |

(Continued)

FOREIGN PATENT DOCUMENTS

| JP | A-61-089623 | 5/1986 |
| JP | A-04-043646 | 2/1992 |

(Continued)

OTHER PUBLICATIONS

International Search Report issued in International Application No. PCT/JP2012/006298 dated Dec. 11, 2012.

*Primary Examiner* — Telly Green
(74) *Attorney, Agent, or Firm* — Oliff PLC

(57) ABSTRACT

A method for manufacturing an epitaxial wafer for manufacture of an image pickup device, wherein, before the growth of the epitaxial layer, a thickness X of a region where oxygen concentration in the epitaxial layer becomes $4\times10^{17}$ atoms/cm$^3$ or more after the manufacture of the image pickup device is calculated and, in the growth of the epitaxial layer, the epitaxial layer is grown with a thickness such that a thickness of a region where the oxygen concentration in the epitaxial layer is less than $4\times10^{17}$ atoms/cm$^3$ after the manufacture of the image pickup device is 6 μm or more in addition to the thickness X. As a result, it is possible to provide the epitaxial wafer in which an adverse effect of an impurity such as oxygen in the silicon wafer is not exerted on an image pickup device forming portion of the epitaxial layer and a manufacturing method thereof.

19 Claims, 3 Drawing Sheets

(51) Int. Cl.
*H01L 27/148* (2006.01)
*C30B 15/20* (2006.01)
*H01L 27/146* (2006.01)
*H01L 29/36* (2006.01)
*H01L 31/0288* (2006.01)
*C30B 15/00* (2006.01)
*C30B 29/06* (2006.01)
*H01L 21/02* (2006.01)

(52) U.S. Cl.
CPC .......... *C30B 29/06* (2013.01); *H01L 21/0257* (2013.01); *H01L 21/02532* (2013.01); *H01L 21/3225* (2013.01); *H01L 27/14687* (2013.01); *H01L 27/14843* (2013.01); *H01L 29/36* (2013.01); *H01L 31/0288* (2013.01); *H01L 21/02381* (2013.01); *H01L 21/02576* (2013.01); *H01L 21/02658* (2013.01)

(56) References Cited

U.S. PATENT DOCUMENTS

| | | |
|---|---|---|
| 2009/0224367 A1 | 9/2009 | Kurita et al. |
| 2011/0084367 A1 | 4/2011 | Nishihata et al. |

FOREIGN PATENT DOCUMENTS

| | | |
|---|---|---|
| JP | A-06-163410 | 6/1994 |
| JP | A-10-041311 | 2/1998 |
| JP | A-2001-102384 | 4/2001 |
| JP | A-2001-237247 | 8/2001 |
| JP | A-2003-151984 | 5/2003 |
| JP | A-2004-221491 | 8/2004 |
| JP | A-2009-212351 | 9/2009 |
| JP | A-2009-212352 | 9/2009 |
| JP | A-2009-274888 | 11/2009 |
| JP | A-2011-082443 | 4/2011 |

\* cited by examiner

EPITAXIAL WAFER AND MANUFACTURING METHOD THEREOF

BACKGROUND OF THE INVENTION

1. Field of the Invention

The present invention relates to an epitaxial wafer for manufacture of an image pickup device and a manufacturing method thereof.

2. Description of the Related Art

As a silicon wafer used for a solid state image pickup device, an epitaxial wafer that can uniform in-plane or inter-wafer resistivities is used in order to generate carriers by a photoelectric effect at the time of forming a photodiode (image pickup device) or assure a uniform operation at the time of storing the carriers with the use of a square well potential. Although the photodiode is formed in this epitaxial layer, a two-layer epitaxial layer or a multilayer epitaxial layer in which an epitaxial layer with a low resistivity is formed below a layer in which a photodiode is formed may be used in order to allow an unnecessary electric charge to flow from the photodiode. For example, a structure called n/n$^+$/n in which an epitaxial layer with a low resistivity (an n$^+$ layer: which is often expressed with adding "+" since an amount of dopant is high) is grown on an n-type silicon wafer and an epitaxial layer with a ordinary resistivity is grown thereon is relatively often used.

As characteristics concerning a silicon wafer for manufacture of an image pickup device, there is a gettering technique. In an image pickup device, an image defect which is called a white scratch may be produced in some cases, and it is known that this defect is caused due to an impurity or the like. As a technique for avoiding this impurity, there is known a gettering technique for capturing an impurity in a strain field with using a thermal environment during manufacture of an image pickup device by forming an oxide precipitate (BMD) in a silicon wafer (intrinsic gettering) or forming a mechanical damage or strain to a lower surface side of the silicon wafer (extrinsic gettering). In the silicon wafer for manufacture of an image pickup device, there is used a method disclosed in Patent Literatures 1 and 2 and others for doping a carbon and improving (increasing and controlling) a BMD in order to further enhance this gettering capability.

As characteristics concerning the epitaxial layer, not only uniformity of the resistivity but also a thickness of the epitaxial is characteristic. Although a photodiode is formed in the epitaxial layer, a photoelectric effect is caused by lights condensed by a lens and color-coded by color filters in this portion, and the number of carriers produced by this effect is detected as intensity of the lights. Although a penetration depth of light differs depending on each wavelength, and a depth that allows intensity of light to be a half is approximately 0.3 μm in case of blue, and it is approximately 3 μm in case of red. Since a value of approximately 3 μm is required for a thickness of the epitaxial layer at minimum in order to efficiently receive light of a red color, a value of 4 μm or more is required when this depth is added to a region which is formed below the epitaxial layer and from which carriers are discharged, and it is general to grow the epitaxial layer with the thickness more than a thickness of a epitaxial layer that is often used for a memory or a logic. As a disclosure example of a thick epitaxial layer, there is almost no discussion about the thickness of the epitaxial layer in Patent Literatures 3 to 5, but 2 to 10 μm or 1 to 20 μm is described. Further, Patent Literatures 6 and 7 have a description of a thickness of the epitaxial layer that is 11 μm or 12 μm in examples, and an example using a thick epitaxial layer for an image pickup device is also present in the past. However, when the thickness of the epitaxial layer is grown to be thick, a cost thereby rises, the thickness of the epitaxial layer cannot be increased limitlessly, and hence approximately 4 to 6 μm is a realistic thickness as a thickness of a real epitaxial layer actually used for an image pickup device.

However, in recent years, it has been revealed that a distribution of an impurity contained in a silicon wafer causes an adverse effect. The silicon wafer is generally sliced out from silicon single crystal grown by a CZ method (including an MCZ method). In such a crystal growth method, a silicon raw material is molten in a quartz crucible, and the silicon single crystal is grown from this material, and each oxygen atom that has eluted from the quartz crucible is contained in the silicon single crystal with a supersaturation state. This oxygen atom is useful as a BMD of the intrinsic gettering. That is, each excessive oxygen atom in the silicon single crystal reacts with Si and precipitates in the silicon single crystal with the form of $SiO_2$ via a thermal process in manufacture of a device or the like. This is called the BMD (Bulk Micro Defect).

Furthermore, besides the oxygen atom, a dopant is contained in the silicon single crystal based on the CZ method in order to control a resistivity. Atoms such as B in the group 3 or P, As, and Sb in the group 5 are general. Further, a carbon atom is also contained as an impurity in the silicon single crystal having carbon doped therein. These dopants or the oxygen/carbon atoms are taken into the silicon single crystal by segregation. However, impurity concentration in the silicon single crystal is non-uniform due to a point that concentration in an impurity in a silicon melt is not completely uniform, a point that an effective segregation coefficient varies in tandem with a growth rate since the growth rate is not fixed but fluctuates in accordance with a fluctuation in a temperature in a furnace or a diameter of crystal. At this time, since a growth interface of the silicon single crystal is not flat but generally has an upwardly protruding shape and the silicon single crystal is grown while rotating it, and hence a concentric circular striation-like concentration distribution is formed. This is called a striation or a growth striation.

In recent years, it has been revealed that a defect that coincides with this concentration is produced on an image pickup device. As contents of a defect includes a dark current in which a carrier is generated even though light does not enter or an abnormality of an energy barrier height at the time of storing generated electric charges in a square well potential. Therefore, a striation-like impurity distribution must be reduced during the single crystal growth. As technology for this, Patent Literature 8 suggests to suppress growth rate within a fixed range.

Patent Literature 1: Japanese Unexamined Patent Application Publication No. 2001-102384
Patent Literature 2: Japanese Unexamined Patent Application Publication No. 2001-237247
Patent Literature 3: Japanese Unexamined Patent Application Publication No. 2009-212351
Patent Literature 4: Japanese Unexamined Patent Application Publication No. 2009-212352
Patent Literature 5: Japanese Unexamined Patent Application Publication No. 2011-82443
Patent Literature 6: Japanese Unexamined Patent Application Publication No. Hei 6-163410
Patent Literature 7: Japanese Unexamined Patent Application Publication No. Hei 10-41311
Patent Literature 8: Japanese Unexamined Patent Application Publication No. 2009-274888

SUMMARY OF THE INVENTION

However, it has been found out that the above-described techniques alone are not enough in a flow of recent further miniaturization/sensitivity improvement and a problem of a dark current or a potential abnormality can possibly reoccur in some cases. The present inventors have analyzed this problem and assumed that oxygen atoms contained in a silicon wafer diffuse to an epitaxial layer during manufacture of an image pickup device, the oxygen turns to, for example, a donor, and the above-described problem is caused. Examples of a thick epitaxial layer like Patent Literatures 6 and 7 are present even though they are few in number, an impurity in the epitaxial layer is not described in these patent literatures, and it cannot be said that these patent literatures are enough.

In view of the above-described problem, it is an object of the present invention to provide an epitaxial wafer in which an adverse effect of an impurity such as oxygen in a silicon wafer is not exerted on an image pickup device forming portion of an epitaxial layer and a manufacturing method thereof.

To achieve this object, according to the present invention, there is provided a method for manufacturing an epitaxial wafer for manufacture of an image pickup device by growing silicon single crystal based on a CZ method, fabricating a silicon wafer from the silicon single crystal, and growing an epitaxial layer on the silicon wafer, wherein, before the growth of the epitaxial layer, growing an epitaxial layer on the silicon wafer, a thickness X of a region where oxygen concentration in the epitaxial layer becomes $4\times10^{17}$ atoms/cm$^3$ or more after the manufacture of the image pickup device by diffusing oxygen into the epitaxial layer from the silicon wafer during the manufacture of the image pickup device, is calculated, and in the growth of the epitaxial layer, the epitaxial layer is grown with a thickness such that a thickness of a region where the oxygen concentration in the epitaxial layer is less than $4\times10^{17}$ atoms/cm$^3$ after the manufacture of the image pickup device is 6 μm or more in addition to the thickness X.

According to such a manufacturing method, it is possible to manufacture the epitaxial wafer in which the adverse effect of an impurity such as oxygen in the silicon wafer is not exerted on the image pickup device forming portion of the epitaxial layer.

Further, it is preferable, before the growth of the epitaxial layer, to calculate the thickness X based on the following expression:

$$4\times10^{17}=([Oi]_{ini}+[Oi]_{sol}(T))/2-([Oi]_{ini}-[Oi]_{sol}(T))/2\times erf[X/\{2\sqrt{(D(T)t)}\}]$$

(where $[Oi]_{ini}$ is initial oxygen concentration in the silicon wafer, T is a temperature in a thermal process with the highest temperature during the manufacture of the image pickup device, $[Oi]_{sol}(T)$ is solid solubility of the oxygen at the temperature T, D(T) is a diffusion coefficient of the oxygen at the temperature T, t is a processing time of the thermal process at the temperature T, and erf is an error function.)

As described above, the concentration of the oxygen that diffuses into the epitaxial layer from the silicon wafer due to the thermal process in the manufacture of the image pickup device can be represented as a function of the thickness X.

Furthermore, in the growth of the epitaxial layer, a multilayer epitaxial layer can be grown as the epitaxial layer.

As described above, even if the multilayer epitaxial layer having different resistivities or conductivity types is grown, when the method for manufacturing the epitaxial wafer according to the present invention is used, the adverse effect of an impurity such as oxygen in the silicon wafer is not exerted on the image pickup device forming portion.

Moreover, it is preferable, in the growth of the epitaxial layer, to grow the epitaxial layer with a thickness such that a thickness of a region where the oxygen concentration in the epitaxial layer is less than $4\times10^{17}$ atoms/cm$^3$ after the manufacture of the image pickup device is 6 μm or more in addition to the thickness X, namely, a thickness of 9 μm or more and 20 μm or less of the entire epitaxial layer.

In the recent image pickup device manufacturing process, it is often the case that a heat treatment that enables forming a gate oxide film is a process with the highest temperature, a thickness of a region where the oxygen concentration in the epitaxial layer becomes $4\times10^{17}$ atoms/cm$^3$ or more after this process is estimated to be approximately 3 μm. Therefore, it is desirable to form the epitaxial layer with a thickness of 9 μm or more, and a larger thickness is preferred. Additionally, a thickness of 20 μm or less can result in good cost performance.

Further, in the growth of the silicon single crystal, the silicon single crystal can be grown by doping carbon in such a manner that carbon concentration becomes $1.3\times10^{16}$ to $22\times10^{16}$ atoms/cm$^3$ (ASTM' 74) and controlling the oxygen concentration to become $8\times10^{17}$ to $16\times10^{17}$ atoms/cm$^3$ (ASTM' 79).

As described above, in case of the silicon single crystal having the carbon doped therein, the BMD improvement effect can be obtained if the carbon concentration is $1.3\times10^{16}$ atoms/cm$^3$ or more, a solubility limit of the carbon in the silicon single crystal is not reached if the carbon concentration is $22\times10^{16}$ atoms/cm$^3$ or less and hence formation of the single crystal can be easily facilitated. Furthermore, the BMD can be easily formed if the oxygen concentration is $8\times10^{17}$ atoms/cm$^3$ or more, and both the number and a size of the BMDs can be excellent and the gettering capability can be improved if the oxygen concentration is $16\times10^{17}$ atoms/cm$^3$ or less.

Moreover, in the growth of the silicon single crystal, the silicon single crystal can be grown by controlling the oxygen concentration such that the oxygen concentration becomes $16\times10^{17}$ to $24\times10^{17}$ atoms/cm$^3$ (ASTM' 79) without doping carbon.

As described above, even in case of the silicon single crystal in which the carbon is not doped, when the oxygen concentration is $16\times10^{17}$ atoms/cm$^3$ (ASTM' 79) or more, the BDM sufficiently grows. Additionally, when the oxygen concentration is $24\times10^{17}$ atoms/cm$^3$ (ASTM' 79) or less, an amount of precipitated oxygen does not become too high, and a possibility that a different problem, for example, warp of the wafer is caused can be suppressed.

Further, according to the present invention, there is provided an epitaxial wafer for manufacture of an image pickup device, comprising an epitaxial layer grown on a silicon wafer fabricated from a silicon single crystal grown by a CZ method, wherein a region where oxygen concentration in the epitaxial layer is $4\times10^{17}$ atoms/cm$^3$ or more after manufacture of the image pickup device and a region where the oxygen concentration in the epitaxial layer is less than $4\times10^{17}$ atoms/cm$^3$ after the manufacture of the image pickup device are formed in the epitaxial layer by diffusing oxygen into the epitaxial layer from the silicon wafer during the manufacture of the image pickup device, and a thickness of the region where the oxygen concentration is less than $4\times10^{17}$ atoms/cm$^3$ is 6 μm or more.

According to such an epitaxial wafer, the adverse effect of an impurity such as oxygen in the silicon wafer is not exerted on the image pickup device forming portion of the epitaxial layer.

As described above, according to the method for manufacturing an epitaxial wafer, it is possible to manufacture the epitaxial wafer in which the adverse effect of an impurity such as oxygen in the silicon wafer is not exerted over the image pickup device forming portion of the epitaxial layer. Furthermore, in regard to a calculation of the thickness X of the region where the oxygen concentration in the epitaxial layer is $4\times10^{17}$ atoms/cm$^3$ or more after the manufacture of the image pickup device, a complicated calculation is not required, and the calculation can be carried out based on a versatile method. Moreover, by using the silicon wafer having appropriate carbon concentration and oxygen concentration, the epitaxial wafer having the excellent gettering capability can be manufactured. The epitaxial wafer manufactured based on the present invention can be preferably used for a solid image pickup device such as a CCD or CIS used in a digital camera or a mobile phone.

DETAILED DESCRIPTION OF THE PREFERRED EMBODIMENTS

Although the present invention will now be described hereinafter in detail, the present invention is not restricted thereto. As described above, a method for manufacturing an epitaxial wafer in which an adverse effect of an impurity such as oxygen in a silicon wafer is not exerted on an image pickup device forming portion of an epitaxial layer has been demanded.

As a result of repeatedly conducting keen examinations about the above-described problem, the present inventors discovered that an epitaxial wafer in which an adverse effect of an impurity such as oxygen in a silicon wafer is not exerted on an image pickup device forming portion of an epitaxial layer is obtained by calculating a thickness of a region of the epitaxial layer in which the impurity, for example, oxygen in the silicon wafer adversely affects and growing the epitaxial layer with a thickness obtained by adding the above-described thickness to a thickness of 6 μm or more of a region (an image pickup device forming portion) of the epitaxial layer in which the adverse effect of the impurity, for example, oxygen is not exerted, thereby bringing the present invention to completion.

Figure 1:
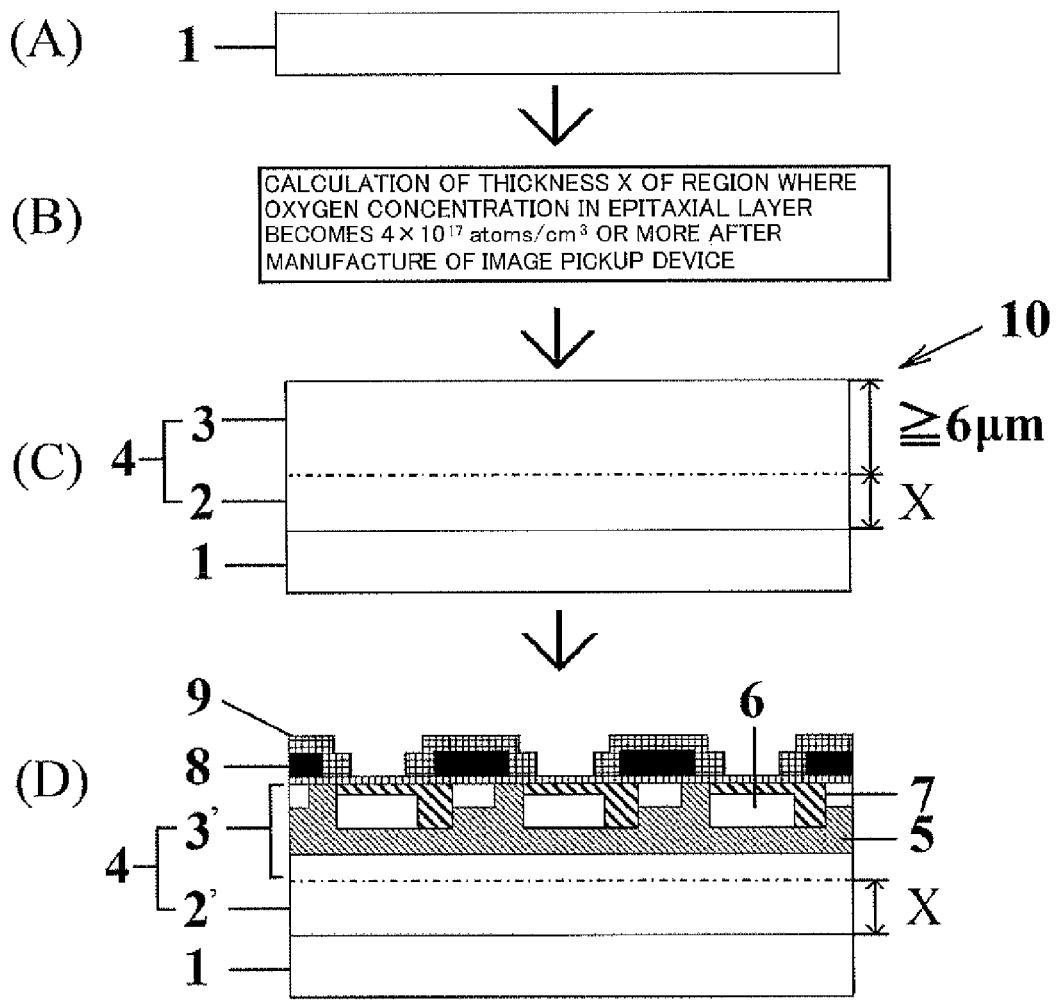
FIG. 1 is a flow diagram of a method for manufacturing an epitaxial wafer according to the present invention.

FIG. 1 shows a flow diagram of the method for manufacturing an epitaxial wafer according to the present invention. In the manufacturing method according to the present invention, silicon single crystal is grown by the CZ method, a silicon wafer 1 is fabricated from the silicon single crystal (FIG. 1(A)), and a thickness X of a region in which oxygen concentration in an epitaxial layer is $4\times10^{17}$ atoms/cm$^3$ or more after manufacture of an image pickup device is calculated before growing the epitaxial wafer (FIG. 1(B)). Then, the epitaxial layer 4 is grown with a thickness such that a thickness of a region where the oxygen concentration in the epitaxial layer 4 is less than $4\times10^{17}$ atoms/cm$^3$ after the manufacture of the image pickup device is 6 μm or more in addition to the thickness X, thereby manufacturing an epitaxial wafer 10 for manufacture of an image pickup device (FIG. 1(C)).

As shown in FIG. 1(D), during a process for manufacturing the image pickup device, oxygen diffuses into the epitaxial layer 4 from the silicon wafer 1 due to its thermal environment. As a result, after the manufacture of the image pickup device, a region where concentration of the diffused oxygen is high and a region where the same is low are formed in the epitaxial layer 4. In the present invention, the region in which the oxygen concentration in the epitaxial layer is $4\times10^{17}$ atoms/cm$^3$ (ASTM' 79) or more after the manufacture of the image pickup device and which is close to the silicon wafer is called a buffer layer 2', and the region in which the oxygen concentration in the epitaxial layer is less than $4\times10^{17}$ atoms/cm$^3$ (ASTM' 79) after the manufacture of the image pickup device and which is apart from the silicon wafer is called an effective layer 3'. Both the buffer layer 2' and the effective layer 3' are the epitaxial layer 4 before the manufacture of the image pickup device. In the present invention, a thickness of the entire epitaxial layer 4 to be grown is a sum of a thickness of the region 2 that turns to the buffer layer 2' after manufacturing the image pickup device and a thickness of the region 3 that turns to the effective layer 3' after manufacturing the image pickup device.

For example, during an image pickup device manufacture process carried out in FIG. 1(D), a P-type well 5 is formed in the epitaxial layer 4 and gate oxide film is formed on the epitaxial layer 4, and each n-type impurity implanting portion 6 and each p-type impurity implanting portion 7 are selectively ion-implanted into the P-type well, whereby each transfer portion and each photodiode are formed. Moreover, each polysilicon electrode 8 is formed thereon, and each light shielding film 9 is formed on a portion excluding each light receiving portion, thereby forming the image pickup device.

As described above, since it has been found out that the oxygen diffuses from the silicon wafer during the manufacture of the image pickup device (FIG. 1(D)) and the diffusion of the oxygen adversely affects device characteristics, in the present invention, the thickness of the region 2 serving as the buffer layer 2' configured to eliminate an influence from the silicon wafer 1 is calculated in advance (FIG. 1(B)), and the epitaxial layer 4 is grown with a thickness such that the thickness of the region 3 serving as the effective layer 3' configured to fabricate the image pickup device is 6 μm or more in addition to the calculated thickness (FIG. 1(C)). As a result, epitaxial wafer for manufacture of an image pickup device having a high-sensitivity and high-integration that is not affected by the silicon wafer can be fabricated.

Here, it is assumed that the region serving as the effective layer after the manufacture of the image pickup device is a region where the oxygen concentration in the epitaxial layer is less than $4\times10^{17}$ atoms/cm$^3$ (ASTM' 79) after the manufacture of the image pickup device, and 6 μm or more is required as its thickness. In case of forming the image pickup device in the effective layer, a photodiode (the image pickup device) portion in which incident light is photoelectrically converted and carriers are generated and stored is formed, and a portion to which an unnecessary electric charge is discharged is formed below this portion. Besides, a portion, for example, a transfer portion that reads intensity of the light sensed by the photodiode is also formed.

As described above, a penetration depth of light differs depending on each wavelength and, for example, a depth that allows reducing the intensity of light to a half is approximately 0.3 μm in case of a blue color, and it is approximately 3 μm in case of a red color. To efficiently receive light of the red color, a thickness of the photodiode must be at least approximately 3 μm. Therefore, a thickness required for the manufacture of the image pickup device including the region to which unnecessary electric charges are discharged is at least 4 μm or more. Although the necessary thickness basically concerns the design of the image pickup device and cannot be completely determined, the thickness required for the region serving as the effective layer is determined to be 6 µm or more in the present invention in view of realization of high sensitivity of a recent image pickup device.

Further, the region that serves as the buffer layer after the manufacture of the image pickup device is the region where the oxygen concentration in the epitaxial layer is $4 \times 10^{17}$ atoms/cm$^3$ (ASTM' 79) or more after the manufacture of the image pickup device. The region that turns to the buffer layer after the manufacture of the image pickup device and the region that turns to the effective layer after the manufacture of the image pickup device are separated from each other based on the oxygen concentration of $4 \times 10^{17}$ atoms/cm$^3$ (ASTM' 79) because oxygen donors are considered to be produced due to a low-temperature heat treatment in wiring or packaging carried out in a post-process or the like of the manufacture of the image pickup device. The oxygen donors are greatly reduced if the oxygen concentration is decreased. According to experimental data obtained by the present inventors, in a case where a heat treatment was performed for five hours at 450° C. that the oxygen donors are mostly liable to be produced, approximately $8 \times 10^{11}$ atoms/cm$^3$ of carriers were generated when the oxygen concentration was $4 \times 10^{17}$ atoms/cm$^3$ (ASTM' 79), approximately $5 \times 10^{13}$ atoms/cm$^3$ of carriers were generated when the oxygen concentration was $8 \times 10^{17}$ atoms/cm$^3$ (ASTM' 79), and approximately $6 \times 10^{14}$ atoms/cm$^3$ of carriers were generated when the oxygen concentration was $12 \times 10^{17}$ atoms/cm$^3$ (ASTM' 79). Based on this result, it can be understood that the carriers caused due to the oxygen donors incommensurably increase as the oxygen concentration doubles and triples. Since original dopant concentration in an area close to a position where a photodiode is fabricated is approximately $10^{14}$ to $10^{15}$, it is desirable for the donor concentration to be lower than this value by approximately two digits in order to avoid an adverse effect of the carriers caused due to the oxygen donor. Therefore, the portion where the oxygen concentration is $4 \times 10^{17}$ atoms/cm$^3$ (ASTM' 79) or more is determined as the region that turns to the buffer layer, and the portion where the oxygen concentration is less than $4 \times 10^{17}$ atoms/cm$^3$ (ASTM' 79) excluding the former portion is determined as the region that turns to the effective layer where a photodiode or the like is fabricated.

In general, when a thickness of the epitaxial layer increases, a cost also rises. Although a process for growing the epitaxial layer has a step such as load/unload of a wafer or preprocess, a process that determines a process time mostly is the process for growing the epitaxial layer. That is because a growth rate of the epitaxial layer is very low. Thus, growing the thick epitaxial layer directly leads to an increase in cost. Therefore, it is common that the thickness of the epitaxial layer is not increased beyond a necessary thickness. However, the present invention is sufficiently characterized in that the region serving as the buffer layer configured to suppress an influence of the silicon wafer is provided in addition to the thickness necessary for fabricating a photodiode or the like that is required in the conventional technology. As a result, an improvement in performance due to an increase in thickness of the epitaxial layer can be expected with respect to an anticipated demand for miniaturization/high sensitivity, and a product with excellent cost performance can be eventually provided.

Furthermore, when the thickness of the buffer layer is determined as follows, an operation for confirming the oxygen concentration after the manufacture of the image pickup device can be omitted. Assuming that a length of the epitaxial layer side from an interface between the silicon wafer and the epitaxial layer, i.e., the thickness of the region that turns to the buffer layer is X, concentration C of oxygen that diffuses into the epitaxial layer from the silicon wafer due to a thermal process can be represented like the following expression as a function of the thickness X. It is to be noted that, in this expression, erf is an abbreviation of an error function and it is generally used for obtaining diffusion concentration.

$$C(X) = ([Oi]_{ini} + [Oi]_{sol}(T))/2 - ([Oi]_{ini} - [Oi]_{sol}(T))/2 \times erf [X/\{2\sqrt{(D(T))t}\}]$$

(where $[Oi]_{ini}$ is initial oxygen concentration in the silicon wafer, T is a temperature in the thermal process with the highest temperature during the manufacture of the image pickup device, $[Oi]_{sol}(T)$ is solid solubility of the oxygen at the temperature T, D(T) is a diffusion coefficient of the oxygen at the temperature T, t is a processing time of the thermal process at the temperature T, and erf is the error function.)

Based on the obtained oxygen concentration distribution, a thickness with which the oxygen concentration becomes $4 \times 10^{17}$ atoms/cm$^3$ (ASTM' 79), i.e., the thickness X of the region that turns to the buffer layer can be determined.

It is to be noted that the diffused oxygen concentration is calculated based on a treatment temperature which is the highest temperature during the manufacture of the image pickup device in the above expression, but the diffusion of the oxygen can be calculated in all heat treatments, e.g., a heat treatment at the time of epitaxial layer growth or any other heat treatment during the manufacture of the image pickup device. However, when the calculation is carried out with respect to each heat treatment, a calculation formula may become complicated, and general versatility of the calculation formula may be jeopardized. On the other hand, the epitaxial growth is performed at a high temperature but effected in a short time, and details of the heat treatment during the manufacture of the image pickup device are a problem concerning know-how of a device manufacturer and are appropriately changed at the time of manufacturing the image pickup device. Furthermore, the number of processes for performing a heat treatment at a high temperature is reduced with an overall decrease in a recent image pickup device manufacturing temperature. Moreover, the diffusion coefficient of the oxygen dramatically drops when a heat treatment temperature lowers. Thus, to provide the calculation formula of the concentration of the diffused oxygen with convenience and general versatility, a trial calculation is done on behalf of the image pickup device manufacturing process with the highest temperature in the above expression, and a ballpark thickness of the region that turns to the buffer layer is determined.

Additionally, in the method for manufacturing an epitaxial wafer according to the present invention, not only one epitaxial layer can be grown but also a multilayer epitaxial layer consisting of two or more layers can be grown in case of forming part of an image pickup device structure at the time of epitaxial growth, for example. In such a multilayer epitaxial wafer, it is good enough for a thickness of overall epitaxial layers which is a sum of thicknesses of the respective epitaxial layers to have a thickness of the region that turns to the buffer layer and the region that turns to the effective layer.

In case of forming the multilayer epitaxial layer, multiple epitaxial layers having different resistivities or conductivity types can be grown. Although an object of the present invention is to prevent an adverse effect of an impurity such as oxygen in the silicon wafer from being exerted on a photodiode forming portion in the epitaxial layers, even if the resistivities are different from each other as described above, concentration of oxygen atoms or carbon atoms in each epitaxial layer is as low as zero as compared with the silicon wafer, and hence each layer having any resistivity can play a role of the region that turns to the buffer layer.

Although the thickness of the region that serves as the buffer layer is a numeral value that is dependent on the design of the image pickup device manufacturing process, it is often the case that a heat treatment for forming a gate oxide film is a process with the highest temperature in processes in recent years. For example, assuming that initial oxygen concentration of a substrate is $14.5 \times 10^{17}$ atoms/cm$^3$ (ASTM' 79) and a temperature and a time required for forming an oxide film are 1000° C. and 60 minutes, a depth that realizes the oxygen concentration of $4 \times 10^{17}$ atoms/cm$^3$ or more is approximately 2.6 μm. Therefore, the ballpark thickness of the region that serves as the buffer layer in the recent image pickup device is assumed to be approximately 3 μm. Since 6 μm or more is required for the region that serves as the effective layer, a minimum thickness of the entire epitaxial layer for the image pickup device is assumed to 9 μm.

Based on the above-description, it is desirable to set the thickness of the entire epitaxial layer to 9 μm or more and 20 μm or less. The upper limit is set to 20 μm since a cost may increase beyond performance. If the epitaxial growth technique is improved and a countermeasure for reducing a cost is found in the future, it can be said that a larger thickness of the epitaxial layer is good.

In the method for manufacturing an epitaxial wafer according to the present invention, in case of the silicon single crystal having carbon doped therein that is used in conventional examples as a measure against white scratches, it is preferable for the carbon concentration to be $1.3 \times 10^{16}$ to $22 \times 10^{16}$ atoms/cm$^3$ (ASTM' 74). If the carbon concentration is $1.3 \times 10^{16}$ atoms/cm$^3$ or more, the BDM improvement effect can be obtained, and if the carbon concentration is $22 \times 10^{16}$ atoms/cm$^3$ or less, the carbon concentration does not reach to a solubility limit of carbon in the silicon single crystal and single crystal can be easily formed.

Additionally, it is preferable for the oxygen concentration of the carbon-doped silicon single crystal to be controlled to $8 \times 10^{17}$ to $16 \times 10^{17}$ atoms/cm$^3$ (ASTM' 79). If the oxygen concentration is $8 \times 10^{17}$ atoms/cm$^3$ or more the BMDs can be easily formed. Further, if the oxygen concentration is $16 \times 10^{17}$ atoms/cm$^3$ or less, both the number and a size of the BMDs are excellent, and the gettering capability can be improved.

Furthermore, in case of the silicon single crystal having no carbon doped therein, if the oxygen concentration is $16 \times 10^{17}$ atoms/cm$^3$ (ASTM' 79) or more, the BMD sufficiently grows. Therefore, as a silicon wafer for a measure against white scratches on the image pickup device, it is also effective to use a silicon wafer that has not carbon doped therein and has the oxygen concentration of $16 \times 10^{17}$ atoms/cm$^3$ (ASTM' 79) or more. Moreover, if the oxygen concentration is $24 \times 10^{17}$ atoms/cm$^3$ (ASTM' 79) or less, an amount of precipitated oxygen is not excessively increased, and a possibility that another problem such as warp of the wafer occurs can be suppressed.

EXAMPLES

Although the present invention will now be described hereinafter in more detail based on examples and a comparative example thereof, the present invention is not restricted to the following examples.

Example 1

Silicon single crystal having carbon concentration of $5.4 \times 10^{16}$ atoms/cm$^3$ (ASTM' 74), oxygen concentration of $14.2 \times 10^{17}$ atoms/cm$^3$ (ASTM' 79), and a diameter of 300 mm was grown by using an MCZ method which is the CZ method with a magnetic field applied thereto, and a wafer sliced out from this silicon single crystal was polished to turn to a silicon wafer.

Figure 2:
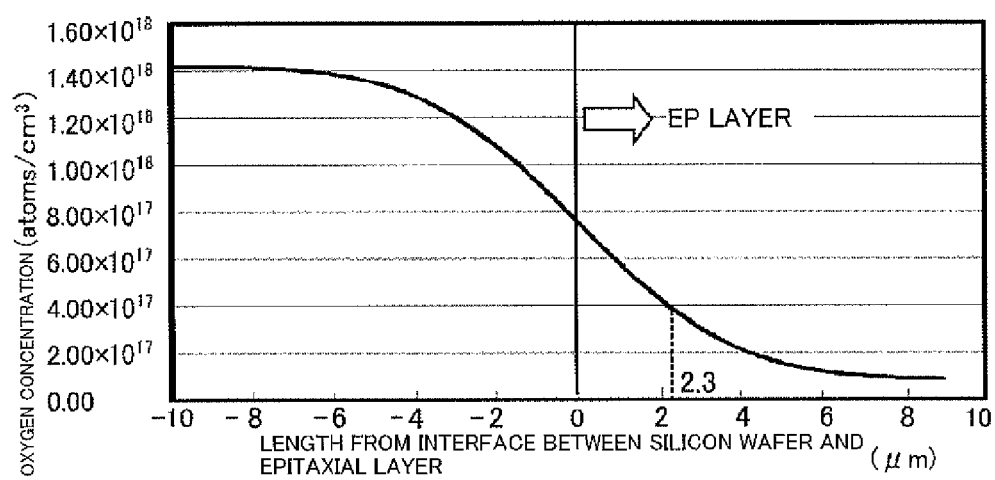
FIG. 2 is a view showing a distribution of oxygen concentration when an epitaxial wafer meeting conditions in Example 1 is subjected to a thermal simulation.

A heat treatment that is considered to affect diffusion of oxygen mostly is a gate oxidation heat treatment, and it was specifically expected to be performed in a dry oxidizing atmosphere at 1000° C. for 60 minutes. A thickness of a region where the oxygen concentration in an epitaxial layer after manufacture of an image pickup device becomes $4 \times 10^{17}$ atoms/cm$^3$ (ASTM' 79) or more is calculated as 2.3 μm based on the above expression as shown in FIG. 2 based on the oxygen concentration and the heat treatment conditions. Assuming that a depth of a photodiode forming region is 6 μm, a thickness required for avoiding an influence of the silicon wafer is 8.3 μm. It is to be noted that a diffusion coefficient D(T) of oxygen was calculated based on $D(T)=D_o\exp(-E_o/kT)$, $D_o=0.13$ (cm$^2$/s), $E_o=2.53$ (eV), a solid solubility of the oxygen $[Oi]_{sol}(T)$ is $[Oi]_{sol}(T)=[Oi]_o\exp(-E_{oi}/kT)$, $[Oi]_o=9.00\times10^{22}$ (atoms/cm$^3$), and $E_{oi}=1.52$ (eV).

Therefore, an epitaxial layer of 9 μm thicker than 8.3 μm obtained by the trial calculation was grown on the silicon wafer and then subjected to an image pickup device process. As the epitaxial layer, a P-doped re-type layer was formed. Moreover, as an outline of the image pickup device process, a P-type well was formed in an n-type epitaxial layer and gate oxide film was formed on an n-type epitaxial layer, and n-type and p-type impurities were selectively ion-implanted into this well, whereby a transfer portion and a photodiode were formed. A polysilicon electrode was formed thereon, and a light-shielding film was formed on each portion excluding a light receiving portion, thereby forming an image pickup device.

As a result, in Example 1, a streak dark current abnormality was not detected. Additionally, BMDs corresponding to $1 \times 10^9$/cm$^3$ or more that were considered to be sufficient for suppressing white scratches were detected from the silicon wafer by a light scattering method. Therefore, it can be considered that the result representing that the thickness of the epitaxial layer obtained by the trial calculation must be 8.3 μm or more is appropriate.

Comparative Example

Then, a silicon wafer sliced out from the same silicon single crystal (carbon concentration of $5.4 \times 10^{16}$ atoms/cm$^3$ (ASTM' 74), oxygen concentration of $14.2 \times 10^{17}$ atoms/cm$^3$ (ASTM' 79)) was used, and an epitaxial wafer which is completely the same as Example 1 except that a thickness of an epitaxial layer is 6 μm thinner than 8.3 μm obtained by the above-described trial calculation was fabricated. This wafer was subject into the same image pickup device process as Example 1.

As a result, a streak dark current abnormality that was not observed in Example 1 was detected from a manufactured image pickup device. On the other hand, BMDs corresponding to $1 \times 10^9$/cm$^3$ or more that are considered to be sufficient for suppressing white scratches were detected from the silicon wafer by the light scattering method. The BMDs were observed within a wafer surface by an X-ray topography and a light scattering method, a concentric circular striation pattern (corresponding to a stripe) was observed as a gradation of diffracted intensity in the X-ray or greatness or smallness of BMD density in the light scattering method. When the stripe distribution and a streak dark current defective pattern were compared with each other, it was revealed that they have high similarity. Therefore, it can be considered that a failure was caused due to a striation.

Based on a result of the trial calculation in Example 1, the thickness that is necessary to avoid the affection from the silicon wafer is considered to be 8.3 μm. Therefore, it can be considered that a problem occurred in the thickness of the epitaxial layer of 6 μm.

Moreover, a thermal simulation simulating the image pickup device manufacturing process was performed with respect to each of the epitaxial wafers used in Comparative Example and Example 1. In each of these wafers, a distribution of oxygen concentration was measured in a depth direction from a surface by using an SIMS (Secondary Ion-microprobe Mass Spectrometer). As a result, the oxygen concentration was gradually increased from the surface toward the inner side in the wafer used in Comparative Example, and the oxygen concentration reached $4 \times 10^{17}$ atoms/cm$^3$ (ASTM' 79) at a point that was 3.7 μm (2.3 μm from an interface between the silicon wafer and the epitaxial layer) from the surface. On the other hand, in case of the wafer used in Example 1, the oxygen concentration was likewise gradually increased from the surface toward the inner side as shown in FIG. 2, and the oxygen concentration reached $4 \times 10^{17}$ atoms/cm$^3$ (ASTM' 79) at a depth of approximately 6.5 μm (2.5 μm from the interface between the silicon wafer and the epitaxial layer).

Therefore, it was confirmed that the depth required as the effective layer was approximately 6 μm, the sufficient buffer layer should be provided, and the oxygen concentration must be $4 \times 10^{17}$ atoms/cm$^3$ (ASTM' 79) or less in order to function as the effective layer.

Example 2

As different from the silicon wafers used in Comparative Example and Example 1, a silicon wafer was formed from silicon single crystal that has no carbon doped therein and was grown with increased oxygen concentration of $17 \times 10^{17}$ atoms/cm$^3$ (ASTM' 79). This silicon wafer having different oxygen concentration was used, a thermal simulation simulating the image pickup device manufacturing process was carried out, then an oxygen concentration distribution was measured, and an experiment for confirming whether a sufficient thickness of an effective layer could be taken was conducted. At this time, a change in conditions of the image pickup device manufacturing process was assumed, and an oxide film forming heat treatment in the thermal simulation used in Example 1 was set to 1000° C. and a half time which is 30 minutes.

Figure 3:
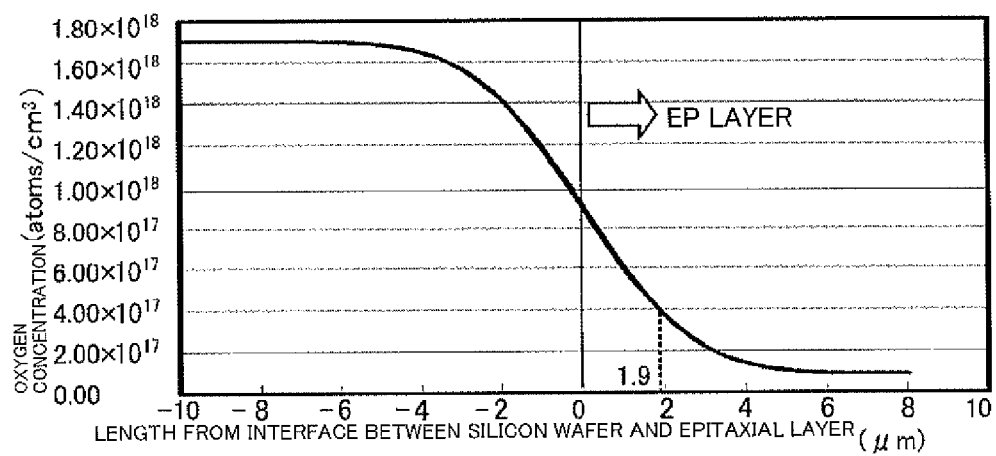
FIG. 3 is a view showing a distribution of oxygen concentration when an epitaxial wafer meeting conditions of Example 2 is subjected to thermal simulation.

The oxygen concentration in the epitaxial layer calculated from the oxygen concentration and heat treatment conditions was as shown in FIG. 3 based on the above-describe expression, and the thickness that meets the oxygen concentration of $4 \times 10^{17}$ atoms/cm$^3$ (ASTM' 79) was estimated as 1.9 μm. Thus, an epitaxial layer with a thickness of 8 μm that was expected to assure 6 μm or more for an effective layer was grown on a high-oxygen concentration silicon wafer that was not subjected to carbon doping. Then, a device simulation heat treatment, which is an oxide film forming heat treatment performed at 1000° C. for 30 minutes, was applied.

A distribution of oxygen concentration in the wafer was measured in a depth direction from a surface by using SIMS (Secondary Ion-microprobe Mass Spectrometer). The oxygen concentration was gradually increased from the surface toward the inner side, and the oxygen concentration reached $4 \times 10^{17}$ atoms/cm$^3$ at a point of 6.2 μm (1.8 μm from the interface between the silicon wafer and the epitaxial layer) from the surface. That is, a thickness of 6 μm of the effective layer required for formation of a photodiode was successfully assured as estimated in a calculation. Additionally, BMDs corresponding to $1 \times 10^9$/cm$^3$ or more that were considered to be sufficient for suppressing white scratches were detected.

As described above, if heat treatment conditions in the image pickup device manufacturing process and the oxygen concentration of the silicon wafer are known in advance, the thickness of the epitaxial layer for assuring the thickness of the effective layer can be estimated in advance and the epitaxial layer can be grown by using the manufacturing method according to the present invention, and the epitaxial wafer in which an adverse effect of an impurity such as oxygen in the silicon wafer is not exerted on the image pickup device forming portion of the epitaxial layer can be manufactured, and a defect ratio can be reduced.

It is to be noted that the present invention is not restricted to the foregoing embodiment. The foregoing embodiment is just an illustrative example, and any example that has substantially the same structure and exercises the same functions and effect as the technical concept described in claims according to the present invention is included in the technical scope of the present invention.

The invention claimed is:

1. A method for manufacturing an epitaxial wafer for manufacture of an image pickup device by growing silicon single crystal based on a CZ method, fabricating a silicon wafer from the silicon single crystal, and growing an epitaxial layer on the silicon wafer, wherein, before the growth of the epitaxial layer, a thickness X of a region where oxygen concentration in the epitaxial layer becomes $4 \times 10^{17}$ atoms/cm$^3$ or more after the manufacture of the image pickup device by diffusing oxygen into the epitaxial layer from the silicon wafer during the manufacture of the image pickup device, is calculated, and in the growth of the epitaxial layer, the epitaxial layer is grown with a thickness such that a thickness of a region where the oxygen concentration in the epitaxial layer is less than $4 \times 10^{17}$ atoms/cm$^3$ after the manufacture of the image pickup device is 6μm or more in addition to the thickness X.

2. The method for manufacturing an epitaxial wafer according to claim 1, wherein, before the growth of the epitaxial layer, the thickness X is calculated based on the following formula, $$4 \times 10^{17} = ([Oi]_{ini} + [Oi]_{sol}(T))/2 - ([Oi]_{ini} - [Oi]_{sol}(T))/2 \times erf[X/\{2\sqrt{(D(T)t)}\}],$$

and wherein $[Oi]_{ini}$ represents initial oxygen concentration in the silicon wafer, T is a temperature in a thermal process with the highest temperature during the manufacture of the image pickup device, $[Oi]_{sol}(T)$ represents solid solubility of the oxygen at the temperature T, D(T) represents a diffusion coefficient of the oxygen at the temperature T, t represents a processing time of the thermal process at the temperature T, and erf represents an error function.

3. The method for manufacturing an epitaxial wafer according to claim 1, wherein, in the growth of the epitaxial layer, a multilayer epitaxial layer is grown as the epitaxial layer.

4. The method for manufacturing an epitaxial wafer according to claim 2, wherein, in the growth of the epitaxial layer, a multilayer epitaxial layer is grown as the epitaxial layer.

5. The method for manufacturing an epitaxial wafer according to claim 1,
wherein, in the growth of the epitaxial layer, the epitaxial layer is grown with a thickness such that a thickness of a region where the oxygen concentration in the epitaxial layer is less than $4 \times 10^{17}$ atoms/cm$^3$ after the manufacture of the image pickup device is 6μm or more in addition to the thickness X, namely, the epitaxial layer is grown with a thickness of 9μm or more and 20μm or less of the entire epitaxial layer.

6. The method for manufacturing an epitaxial wafer according to claim 2,
wherein, in the growth of the epitaxial layer, the epitaxial layer is grown with a thickness such that a thickness of a region where the oxygen concentration in the epitaxial layer is less than $4 \times 10^{17}$ atoms/cm$^3$ after the manufacture of the image pickup device is 6μm or more in addition to the thickness X, namely, the epitaxial layer is grown with a thickness of 9μm or more and 20μm or less of the entire epitaxial layer.

7. The method for manufacturing an epitaxial wafer according to claim 3,
wherein, in the growth of the epitaxial layer, the epitaxial layer is grown with a thickness such that a thickness of a region where the oxygen concentration in the epitaxial layer is less than $4 \times 10^{17}$ atoms/cm$^3$ after the manufacture of the image pickup device is 6μm or more in addition to the thickness X, namely, the epitaxial layer is grown with a thickness of 9μm or more and 20μm or less of the entire epitaxial layer.

8. The method for manufacturing an epitaxial wafer according to claim 4,
wherein, in the growth of the epitaxial layer, the epitaxial layer is grown with a thickness such that a thickness of a region where the oxygen concentration in the epitaxial layer is less than $4 \times 10^{17}$ atoms/cm$^3$ after the manufacture of the image pickup device is 6μm or more in addition to the thickness X, namely, the epitaxial layer is grown with a thickness of 9μm or more and 20μm or less of the entire epitaxial layer.

9. The method for manufacturing an epitaxial wafer according to claim 1,
wherein, in the growth of the silicon single crystal, the silicon single crystal is grown by doping carbon in such a manner that carbon concentration becomes $1.3 \times 10^{16}$ to $22 \times 10^{16}$ atoms/cm$^3$ (ASTM' 74) and controlling the oxygen concentration to become $8 \times 10^{17}$ to $16 \times 10^{17}$ atoms/cm$^3$ (ASTM' 79).

10. The method for manufacturing an epitaxial wafer according to claim 2,
wherein, in the growth of the silicon single crystal, the silicon single crystal is grown by doping carbon in such a manner that carbon concentration becomes $1.3 \times 10^{16}$ to $22 \times 10^{16}$ atoms/cm$^3$ (ASTM' 74) and controlling the oxygen concentration to become $8 \times 10^{17}$ to $16 \times 10^{17}$ atoms/cm$^3$ (ASTM' 79).

11. The method for manufacturing an epitaxial wafer according to claim 3,
wherein, in the growth of the silicon single crystal, the silicon single crystal is grown by doping carbon in such a manner that carbon concentration becomes $1.3 \times 10^{16}$ to $22 \times 10^{16}$ atoms/cm$^3$ (ASTM' 74) and controlling the oxygen concentration to become $8 \times 10^{17}$ to $16 \times 10^{17}$ atoms/cm$^3$ (ASTM' 79).

12. The method for manufacturing an epitaxial wafer according to claim 4,
wherein, in the growth of the silicon single crystal, the silicon single crystal is grown by doping carbon in such a manner that carbon concentration becomes $1.3 \times 10^{16}$ to $22 \times 10^{16}$ atoms/cm$^3$ (ASTM' 74) and controlling the oxygen concentration to become $8 \times 10^{17}$ to $16 \times 10^{17}$ atoms/cm$^3$ (ASTM' 79).

13. The method for manufacturing an epitaxial wafer according to claim 5,
wherein, in the growth of the silicon single crystal, the silicon single crystal is grown by doping carbon in such a manner that carbon concentration becomes $1.3 \times 10^{16}$ to $22 \times 10^{16}$ atoms/cm$^3$ (ASTM' 74) and controlling the oxygen concentration to become $8 \times 10^{17}$ to $16 \times 10^{17}$ atoms/cm$^3$ (ASTM' 79).

14. The method for manufacturing an epitaxial wafer according to claim 6,
wherein, in the growth of the silicon single crystal, the silicon single crystal is grown by doping carbon in such a manner that carbon concentration becomes $1.3 \times 10^{16}$ to $22 \times 10^{16}$ atoms/cm$^3$ (ASTM' 74) and controlling the oxygen concentration to become $8 \times 10^{17}$ to $16 \times 10^{17}$ atoms/cm$^3$ (ASTM' 79).

15. The method for manufacturing an epitaxial wafer according to claim 1,
wherein, in the growth of the silicon single crystal, the silicon single crystal is grown by controlling the oxygen concentration to become $16 \times 10^{17}$ to $24 \times 10^{17}$ atoms/cm$^3$ (ASTM' 79) without doping carbon.

16. The method for manufacturing an epitaxial wafer according to claim 2,
wherein, in the growth of the silicon single crystal, the silicon single crystal is grown by controlling the oxygen concentration to become $16 \times 10^{17}$ to $24 \times 10^{17}$ atoms/cm$^3$ (ASTM' 79) without doping carbon.

17. The method for manufacturing an epitaxial wafer according to claim 3,
wherein, in the growth of the silicon single crystal, the silicon single crystal is grown by controlling the oxygen concentration to become $16 \times 10^{17}$ to $24 \times 10^{17}$ atoms/cm$^3$ (ASTM' 79) without doping carbon.

18. The method for manufacturing an epitaxial wafer according to claim 4,
wherein, in the growth of the silicon single crystal, the silicon single crystal is grown by controlling the oxygen concentration to become $16 \times 10^{17}$ to $24 \times 10^{17}$ atoms/cm$^3$ (ASTM' 79) without doping carbon.

19. The method for manufacturing an epitaxial wafer according to claim 5,
wherein, in the growth of the silicon single crystal, the silicon single crystal is grown by controlling the oxygen concentration to become $16 \times 10^{17}$ to $24 \times 10^{17}$ atoms/cm$^3$ (ASTM' 79) without doping carbon.

* * * * *